United States Patent [19]
Marr

[11] Patent Number: 6,041,008
[45] Date of Patent: Mar. 21, 2000

[54] METHOD AND APPARATUS FOR EMBEDDED READ ONLY MEMORY IN STATIC RANDOM ACCESS MEMORY

[75] Inventor: Kenneth W. Marr, Boise, Id.

[73] Assignee: Micron Technology Inc., Boise, Id.

[21] Appl. No.: 09/076,730

[22] Filed: May 13, 1998

[51] Int. Cl.[7] .................................................. G11C 7/00
[52] U.S. Cl. ...................................... 365/225.7; 365/154
[58] Field of Search ................................ 365/225.7, 154, 365/94, 96, 103

[56] References Cited

U.S. PATENT DOCUMENTS

| | | | |
|---|---|---|---|
| 4,855,803 | 8/1989 | Azumai et al. | 365/154 |
| 4,995,004 | 2/1991 | Lee | 365/225.7 |
| 5,012,181 | 4/1991 | Eccleston | 324/74 |
| 5,365,475 | 11/1994 | Matsumura et al. | 365/154 |
| 5,426,614 | 6/1995 | Harward | 365/225.7 |
| 5,487,037 | 1/1996 | Lee | 365/225.7 |
| 5,744,962 | 4/1998 | Alber et al. | 324/426 |

*Primary Examiner*—David Nelms
*Assistant Examiner*—Anh Phung
*Attorney, Agent, or Firm*—Dickenstein Shapiro Morin & Oshinsky

[57] ABSTRACT

The present invention is embodied in a method and apparatus which provides a ROM embedded in a SRAM array utilizing the existing support circuitry of the SRAM array. By disabling or not disabling SRAM cells by removing or not removing the ground or power connections to each cell in different combinations, a pair of SRAM cells can be used to permanently store a specified logic state, i.e. function as a ROM cell. Additionally, a single SRAM cell and a reference signal can also be programmed to function as a ROM cell.

65 Claims, 6 Drawing Sheets

_6,041,008_

METHOD AND APPARATUS FOR EMBEDDED READ ONLY MEMORY IN STATIC RANDOM ACCESS MEMORY

FIELD OF THE INVENTION

The present invention relates to semiconductor memory devices and, more specifically, to embedded Read Only Memory (ROM) in Static Random Access Memory (SRAM).

BACKGROUND OF THE INVENTION

Memory devices such as static random access memories comprise an array of individual memory cells. Typically, a static RAM cell consists of a basic bistable flip-flop circuit which needs only a DC current applied to retain its memory. A SRAM allows the user both to read information from the memory and to write new information into the memory. Data is read from memory by activating a row, referred to as a word line, which couples all memory cells corresponding to that row to active digit or bit lines which define the columns of the array. When a particular word line is activated, sense amplifiers connected to active bit lines detect and amplify the data by measuring the potential difference between the activated bit lines.

A standard SRAM cell 10 is shown in FIG. 1. Cell 10 consists of four transistors 14, 16, 20 and 22, and two control transistors 12 and 18. Data is stored with either a high potential at node A and a low potential at node B, or a low potential at node A and a high potential at node B. This means that two stable states are available which are defined as a logic '1' or a logic '0'.

Cell 10 is embedded in an array of similar cells as shown in FIG. 2. A typical RAM consists of a matrix of storage bits with bit capacity $2^N \times 2^M$ bits arranged in an array 100 with $2^M$ columns (bit lines) and $2^N$ rows (word lines).

To read data stored in the array, a row address is input and decoded by row decoder 102 to select one of the rows or word lines. All of the cells along this word line are activated. Column decoder 104 then addresses one bit out of the $2^M$ bits that have been activated and routes the data that is stored in that bit to a sense amplifier (not shown) and then out of the array. Data in and Data out are controlled by the Read/Write Control circuit 106.

The logic state of SRAM cell 10 of FIG. 1, i.e. either a '1' or '0', is read by sensing the cell current on bit line pair comprised of bitlines 30 and 32 and/or the differential voltage developed thereon. When wordline 40 is selected, cell 10 is activated by turning on transistors 12 and 18. If the activated SRAM cell is in logic state '1' node A is high and node B is low. Transistor 14 will be off, transistor 16 will be on, transistor 20 will be on, and transistor 22 will be off. Since transistors 16 and 18 are on, bit line 32 will carry cell current, while bit line 30 will not carry any cell current since transistor 14 is off.

The logic state '0' would be the opposite with node A low and node B high. Transistor 14 will be on, transistor 16 will be off, transistor 20 will be off, and transistor 22 will be on. Bit line 30 will carry cell current, while bit line 32 will not carry cell current.

FIG. 3 illustrates how a sense amplifier is differentially connected to a complementary pair of bit lines, e.g. 30, 32, for sensing the state of an addressed cell. The cell current carried by one of the bit lines 30 or 32 will cause a voltage drop on that bit line. This voltage drop may be caused by the cell current acting on the bit line capacitances 110 or 111 (FIG. 3), or the corresponding voltage drop on the bit line loads 115 or 116. The voltage drop on the bit line carrying the cell current creates a voltage differential between bit line 30 and bit line 32, called the bit line spread. Bit lines 30 and 32 are input to sense amplifier 120. Sense amplifier 120 reads the differential input of the bit line spread to determine the stored logic state of cell 10. A signal representing the stored logic state of cell 10 is output from sense amplifier 120 on data line 122.

A major disadvantage of a static RAM is that it is volatile, that is, it will lose its memory if the power is turned off. It is important in many memory system environments that the memory contents be retained when the power is off.

A Read Only Memory (ROM) is non-volatile, that is, it retains its memory when the power is turned off. A ROM cell is a transistor which is effectively either present or absent at a given location in the memory. A ROM is the best memory solution where a fixed program is being stored, such as in gaming machines, language character generators, and operating system storage in computer systems.

A Programmable ROM (PROM) is preprogrammed in the silicon by the memory manufacturer. An Erasable PROM (EPROM) can be erased and reprogrammed by the user utilizing ultraviolet light which enters the memory package through a quartz window. An Electrically Erasable PROM (EEPROM) can be erased electrically, eliminating the need to remove the memory chip from the system and the purchase of expensive ultraviolet light equipment as is needed with an EPROM. A One Time Programmable ROM (OTPROM) can be programmed only once and cannot be changed.

ROMs are typically manufacturer customized parts which are basically limited to market segments and applications with a predefined and relatively long term data storage use. The need for a non-volatile memory often occurs in small volume applications or in applications where the software is undergoing constant updating in order to remain current in a competitive market situation. In many cases, the initial programming cost and minimum volume requirements can make ROMs prohibitively expensive. Thus, the problem exists of providing ROM in a cost effective manner while utilizing existing support circuitry.

SUMMARY OF THE INVENTION

The present invention provides a unique method of and apparatus for embedding a ROM or One Time Programmable ROM in a SRAM such that the support circuitry is that of the SRAM core and can thus be read at the same speeds and in the same fashion as the SRAM array.

In one embodiment, the ROM/OTPROM consists of a pair of SRAM cells, each with a ground path. Each cell is provided with a fuse in the ground path. If a ground connection of one of the cells is removed by opening the fuse, that cell will not have any cell current. Alternatively, the ground connection can be removed by changing a fabrication mask (for ROM) or utilizing a laser process to disconnect a SRAM cell from ground instead of using a fuse. The bit lines from each cell are also connected together, and input into an existing sense amplifier. Based on the different combinations of an open fuse (ground not connected) and an unopened fuse (ground connected), a pair of SRAM cells can be used as a single ROM bit.

In another embodiment in which adjacent SRAM cells share the same ground connection, cell current in one of the SRAM cells is prevented by removing the shared ground connection on one side of the cell. The other side of the cell remains connected to ground. The SRAM cell and half of each adjacent cell can thus be utilized as a single ROM cell.

In another embodiment, a single SRAM cell can be used as a ROM cell. In this embodiment, the flow of cell current is also controlled by opening the ground path of the SRAM cell, using a fuse, laser or during the masking process. The bit lines from the SRAM cell are connected together and compared to a reference voltage in a sense amplifier to determine the cell contents.

These and other advantages and features of the invention will become apparent from the following detailed description of the invention which is provided in connection with the accompanying drawings.

DETAILED DESCRIPTION OF PREFERRED EMBODIMENTS

The present invention will be described as set forth in the preferred embodiments illustrated in FIGS. 4–7. Other embodiments may be utilized and structural or logical changes may be made without departing from the scope of the present invention.

Figure 1:
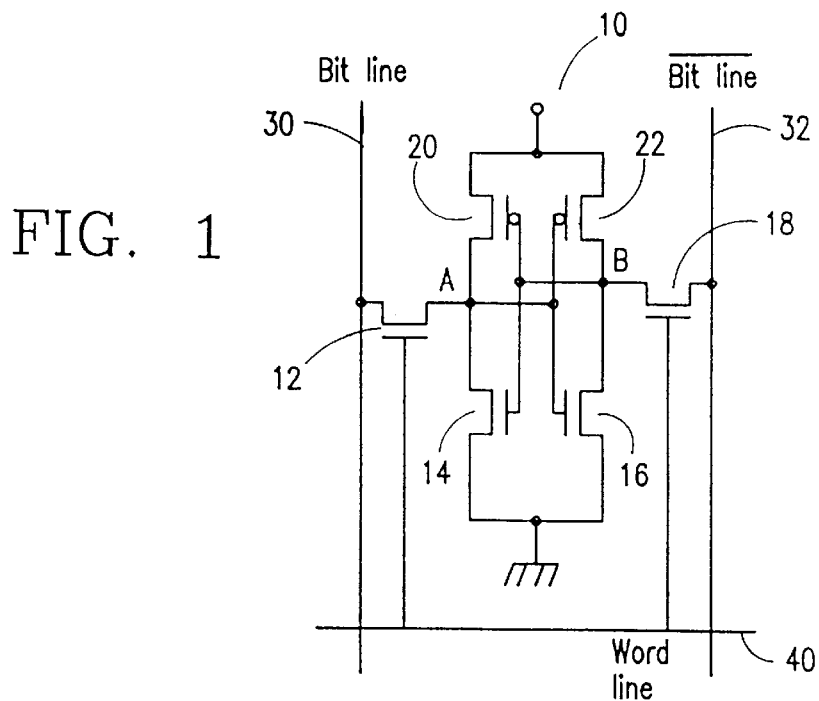
FIG. 1 illustrates a schematic diagram of a standard SRAM cell.
Figure 2:
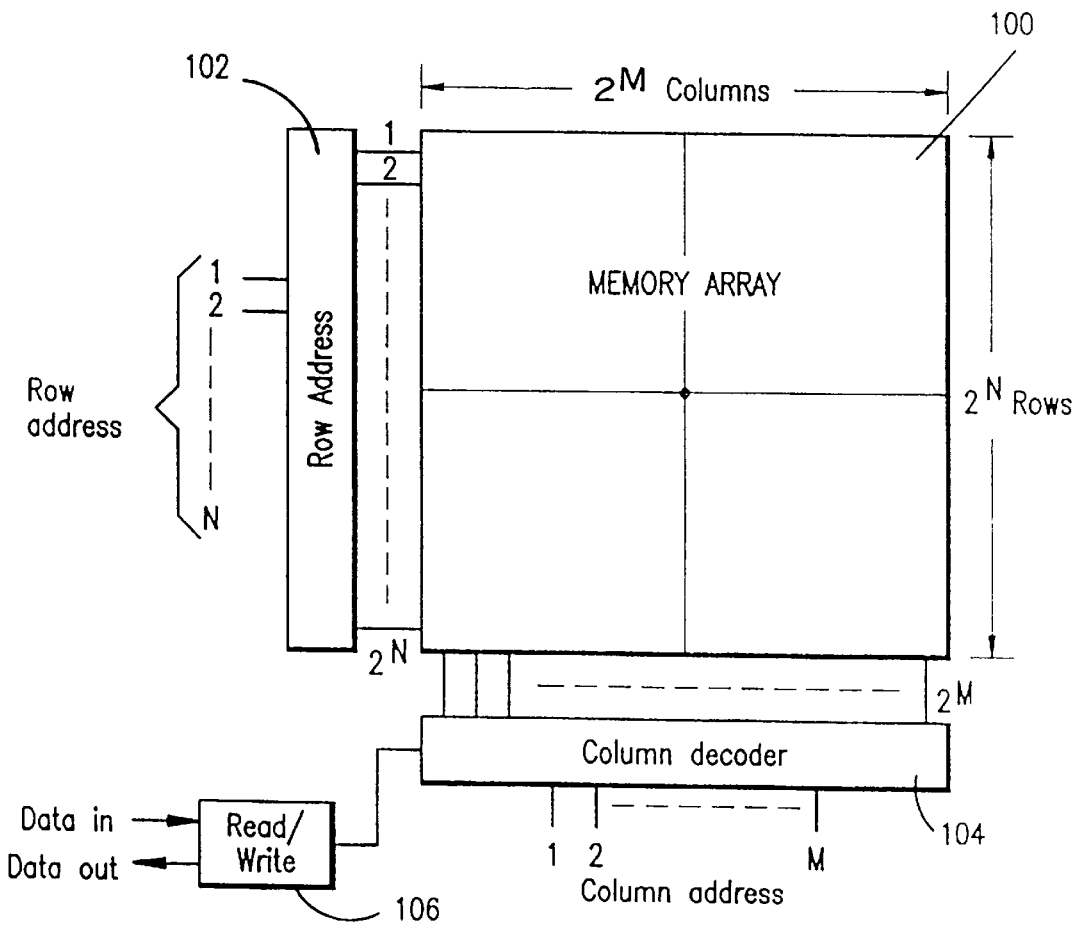
FIG. 2 illustrates a typical SRAM memory in block diagram form.
Figure 3:
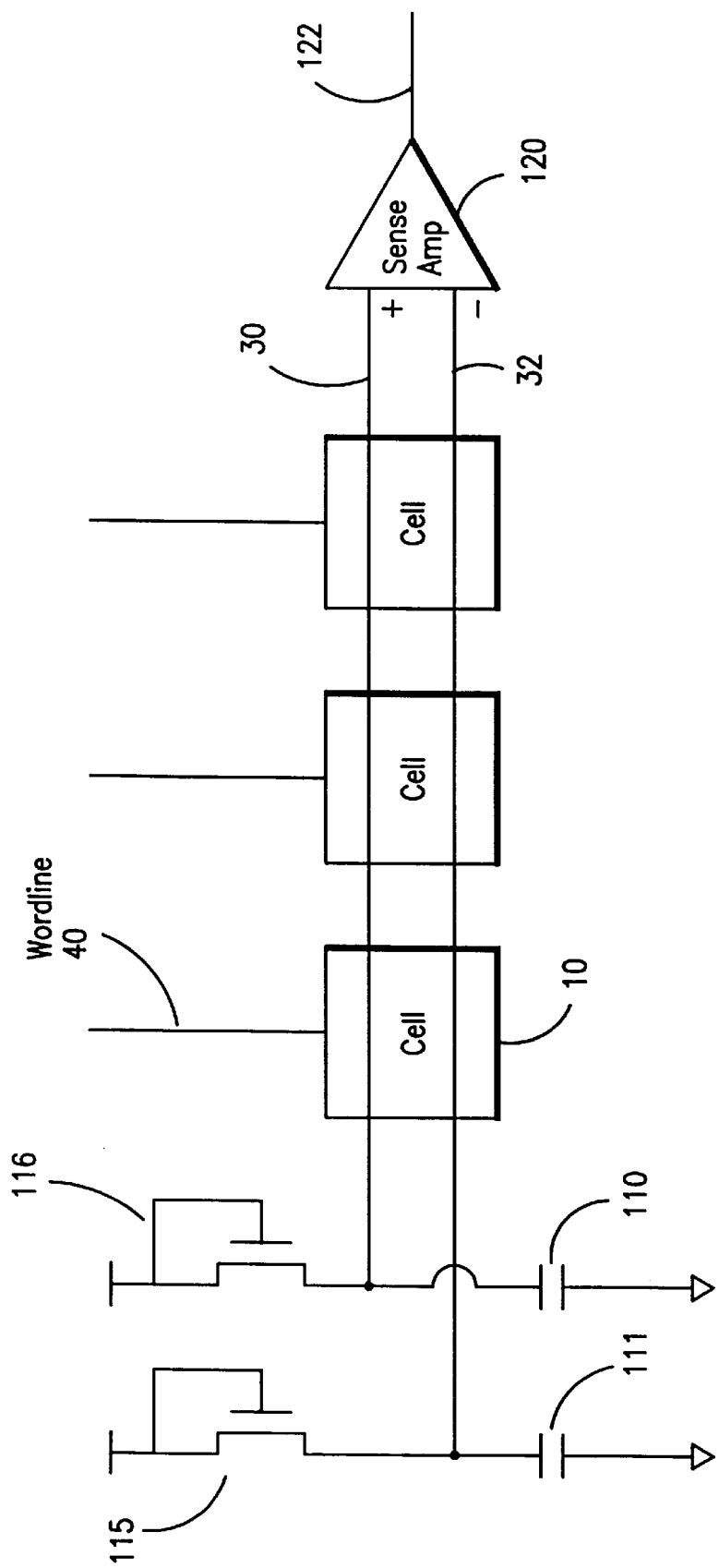
FIG. 3 illustrates a portion of the memory array shown in FIG. 2.
Figure 4:
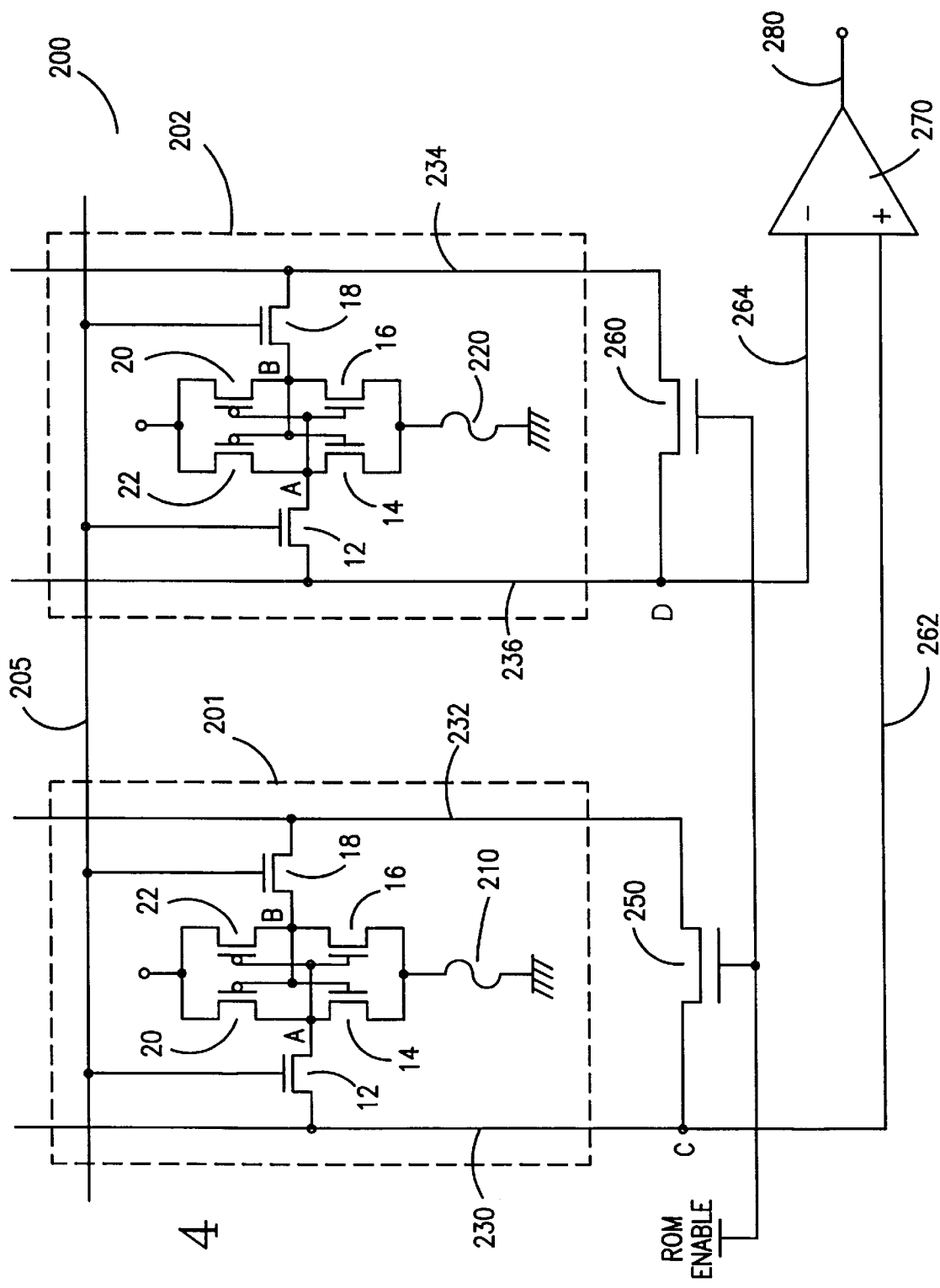
FIG. 4 illustrates a schematic of a ROM cell according to a first embodiment of the present invention.

A ROM cell 200 according to a first embodiment of the present invention is illustrated generally in FIG. 4. ROM cell 200 comprises two SRAM cells 201 and 202. Each of SRAM cells 201 and 202 is comprised of six transistors 12, 14, 16, 18, 20 and 22 as hereinbefore described with reference to FIG. 1. SRAM cell 201 is activated by word line 205, and outputs the cell contents on bit lines 230, 232. Cell 202 is activated by word line 205, and outputs the cell contents on bit lines 234, 236. The operation of cells 201, 202 is identical to that of cell 10 described with reference to FIG. 1 and will not be repeated here.

In accordance with the present invention, cell 201 has electrical fuse 210 located in its ground path, and cell 202 has electrical fuse 220 located in its ground path. The bit lines 230, 232 of cell 201 are connected together at node C through transistor 250. The bit lines 234, 236 of cell 202 are connected together at node D through transistor 260. The gate of each of transistor 250, 260 is connected to a ROM Enable signal. The signal at node C is input to one input terminal of sense amplifier 270 by line 262, while the signal at node D is input to the other input terminal of sense amplifier 270 by line 264.

The operation of ROM cell 200 is as follows. By opening fuse 210, and thus removing the ground connection of cell 201, or opening fuse 220, and thus removing the ground connection of cell 202, ROM cell 200 can be programmed. The fuses can be opened during processing of the memory or on a complete packaged part.

Referring to cell 201 of ROM cell 200, when power is provided to the memory, it will assume a random state, i.e. either a logic '1' or a logic '0', since the cell has not been written with either a '1' or '0'. If fuse 210 is not open, the cell 201 is connected to ground. Depending upon the logic state, cell current will flow through either bit line 232 (if the logic state is '1') or through bit line 230 (if the logic state is '0'). When transistor 250 is turned on by a ROM Enable signal, bit lines 232 and 230 are connected together at node C. The cell current from either bit line 230 or 232 will be carried by line 262 regardless of the logic state of cell 201. The voltage drop associated with the cell current will be carried by line 262 for input into sense amplifier 270.

If fuse 210 of cell 201 is open, cell current will be unable to flow in either bit line 232 or bit line 230. Thus, because there is no cell current, there will be no associated voltage drop on either bit line. When transistor 250 is turned on by a ROM Enable signal, bit lines 230 and 232 will be connected together at node C. Since there is no cell current due to the open ground connection caused by open fuse 210, there will be no voltage drop on line 262.

The operation of cell 202 is identical to that of cell 201. When power is provided to the memory, it will assume a random state, i.e. either a logic '1' or a logic '0', since the cell has not been written with either a '1' or '0'. If fuse 220 is not open, the cell 202 is connected to ground. Depending upon the logic state, cell current will flow through either bit line 234 (if the logic state is '1') or through bit line 236 (if the logic state is '0'). When transistor 260 is turned on by a ROM Enable signal, bit lines 234 and 236 are connected together at node D. The cell current from either bit line 234 or 236 will be carried by line 264 regardless of the logic state of cell 202. The voltage drop associated with the cell current will be carried by line 264 for input into sense amplifier 270.

If fuse 220 of cell 202 is open, cell current will be unable to flow in either bit line 234 or bit line 236. Thus, because there is no cell current, there will be no associated voltage drop on either bit line. When transistor 260 is turned on by a ROM Enable signal, bit lines 234 and 236 will be connected together at node D. Since there is no cell current due to the open ground connection caused by open fuse 220, there will be no voltage drop on line 264.

By providing two different combinations of the state of fuses 210, 220, i.e. either fuse 210 is open and fuse 220 is not open or fuse 210 is not open and fuse 220 is open, cell 201 and cell 202 can be used together to form a single ROM bit with a stored logic state. For example, if it is desired to store a logic '0' in ROM bit 200, fuse 210 of cell 201 will not be opened and fuse 220 of cell 202 will be opened. When power is applied to the memory, cells 201 and 202 will assume a random state, i.e. either a logic '1' or logic '0'. When word line 205 is activated, cell current will flow in either bit line 230 or 232 depending upon the logic state assumed by cell 201, and there will be no cell current in bit lines 234 or 236 regardless of the logic state assumed by cell 202 because of the open fuse 220 in cell 202. When a ROM Enable signal is applied and transistors 250, 260 are turned on, the voltage drop associated with cell current in either bit line 230 or 232 will appear on line 262. There will be no voltage drop on line 264 since there is no cell current on either bit line 234 or 236. The voltage drop on line 262 will create a voltage differential between line 262 and 264. Sense amplifier 270 will read this differential input and output a signal on line 280 representing a low logic state, i.e. a logic '0'.

If it is desired to store a logic '1' in ROM cell 200, fuse 210 of cell 201 will be opened and fuse 220 of cell 202 will not be opened. When power is applied to the memory, cells 201 and 202 will assume a random state, i.e. either a logic '1' or logic '0'. Because fuse 210 is open, cell current will be unable to flow in either bit line 230 or 232 regardless of the logic state assumed by cell 201. Because fuse 220 in cell 202 is not open and cell 202 is connected to ground, there will be cell current in either bit line 234 or 236 depending on the logic state assumed by cell 202 when power was applied. When a ROM Enable signal is applied and transistors 250, 260 are turned on, the voltage drop associated with cell current in either bit line 234 or 236 will appear on line 264. There will be no voltage drop on line 262 since there is no cell current on either bit line 232 or 230. The voltage drop on line 264 will create a voltage differential between line 262 and 264. Sense amplifier 270 will read this differential input and output a signal on line 280 representing a high logic state, i.e. a logic '1'.

The process for disconnecting the cells from ground is not limited to the use of an electrical fuse as previously described. For example, the ground connection can be removed utilizing a laser fuse. A polysilicon link with contacts at each end is used to connect the cell to ground. A laser is used to vaporize the polysilicon connections during the wafer probe process, thus disconnecting the cell from ground. Alternatively, the ground connection can be removed during the fabrication process by changing the mask used during fabrication to remove the ground connection of the desired cells.

Figure 5:
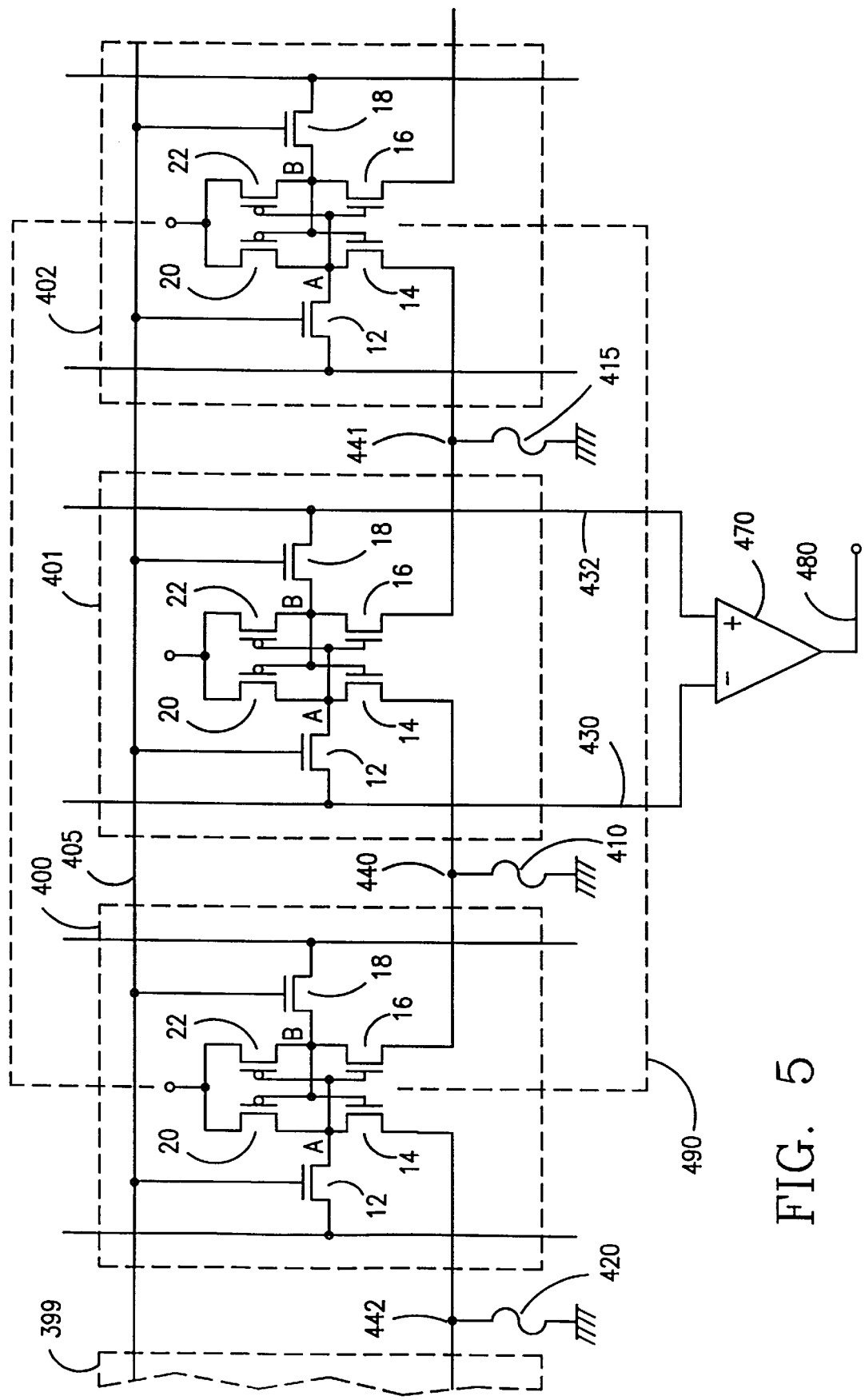
FIG. 5 illustrates a schematic of a ROM cell according to a second embodiment of the present invention.

FIG. 5 illustrates a ROM cell according to a second embodiment of the present invention. Utilizing this embodiment, two SRAM cells, in which adjacent cells of the array share a ground connection, can be used as a single ROM cell.

FIG. 5 illustrates four adjacent SRAM cells 399, 400, 401 and 402 of an SRAM array. The cells are identical in construction and operation as previously described with respect to FIG. 1. Each cell shares a ground connection with the adjacent cell, i.e. transistor 14 of cell 401 shares a ground with transistor 16 of cell 400, and transistor 16 of cell 401 shares a ground with transistor 14 of cell 402, instead of a common ground for the same cell, i.e. transistors 14 and 16 of cell 401 share the same ground. Thus, cell 399 and cell 400 share a ground connection 442, cell 400 and cell 401 share a ground connection 440, cell 401 and cell 402 share a ground connection 441, etc.

In accordance with the present invention, ground path 442 is provided with electrical fuse 420, ground path 440 is provided with electrical fuse 410 and ground path 441 is provided with electrical fuse 415. By opening the fuses in specific combinations, two SRAM cells, i.e. the entirety of SRAM cell 401 and the adjacent half of each cell 400 and 402, can be used as a single ROM cell 490.

The programming of ROM bit 490 is as follows. If it is desired to store a high logic level '1' in ROM bit 490, fuse 410 in ground connection 440 will be opened, while fuse 415 in ground connection 441 will not be opened. The fuse can be opened during processing of the memory or on a complete packaged part.

When power is applied to the memory array, each cell might assume a random state, i.e. either a logic '1' or a logic '0'. The cells are activated by word line 405, which turns on transistors 12 and 18 of each cell. Since fuse 410 is open, there is no ground connection for cell current to flow through bit line 430. The removal of ground connection 440 will effectively eliminate transistor 14 from cell 401, with the resulting remaining circuitry acting as a latch. Since fuse 415 is not open, cell current will flow in bit line 432, and cause an associated voltage drop on bit line 432. Bit lines 430 and 432 are input into sense amplifier 470. The differential input on bit lines 430 and 432 caused by the voltage drop on bit line 432 is read by sense amplifier 470 and a signal is output on line 480 representing a high logic state, i.e. a logic '1'.

If it is desired to store a logic '0' in ROM cell 490, fuse 410 in ground connection 440 will not be opened, while fuse 415 in ground connection 441 will be opened. When power is applied to the memory array, each cell might assume a random state, i.e. either a logic '1' or a logic '0'. The cells are activated by word line 405, which turns on transistors 12 and 18 of each cell. Since fuse 415 is open, there is no ground connection for cell current to flow through bit line 432. The removal of ground connection 441 will effectively eliminate transistor 16 from cell 401, with the resulting remaining circuitry acting as a latch. Since fuse 410 is not open, cell current will flow in bit line 430, and cause an associated voltage drop on bit line 430. Bit lines 430 and 432 are input into sense amplifier 470. The differential input on bit lines 430 and 432 caused by the voltage drop of bit line 430 is read by sense amplifier 470 and a signal is output on line 480 representing a low logic state, i.e. a logic '0'.

The logic state assumed by cells 400 and 402 in either case where ROM cell 490 is programmed to a high logic state or a low logic state is immaterial, since neither of cells 400 nor 402 will be read. Thus, utilizing the present invention, every other cell will be read, and depending upon the configuration of the ground fuses, can be programmed as a ROM cell.

The process for disconnecting the shared ground connections is not limited to the use of an electrical fuse as previously described. For example, the ground connection can be removed utilizing a laser fuse. A polysilicon link with contacts at each end may be used to connect the cells to ground. A laser is used to vaporize the polysilicon connections during the wafer probe process, thus disconnecting the cells from ground. Alternatively, the ground connection can be removed during the fabrication process by changing the mask used during fabrication to remove the ground connection of the desired cells.

An advantage of the embodiment illustrated in FIG. 5 is that the column select circuitry (not shown) for SRAM cell 401 need not be changed to read the ROM cell 490 contents.

Figure 6:
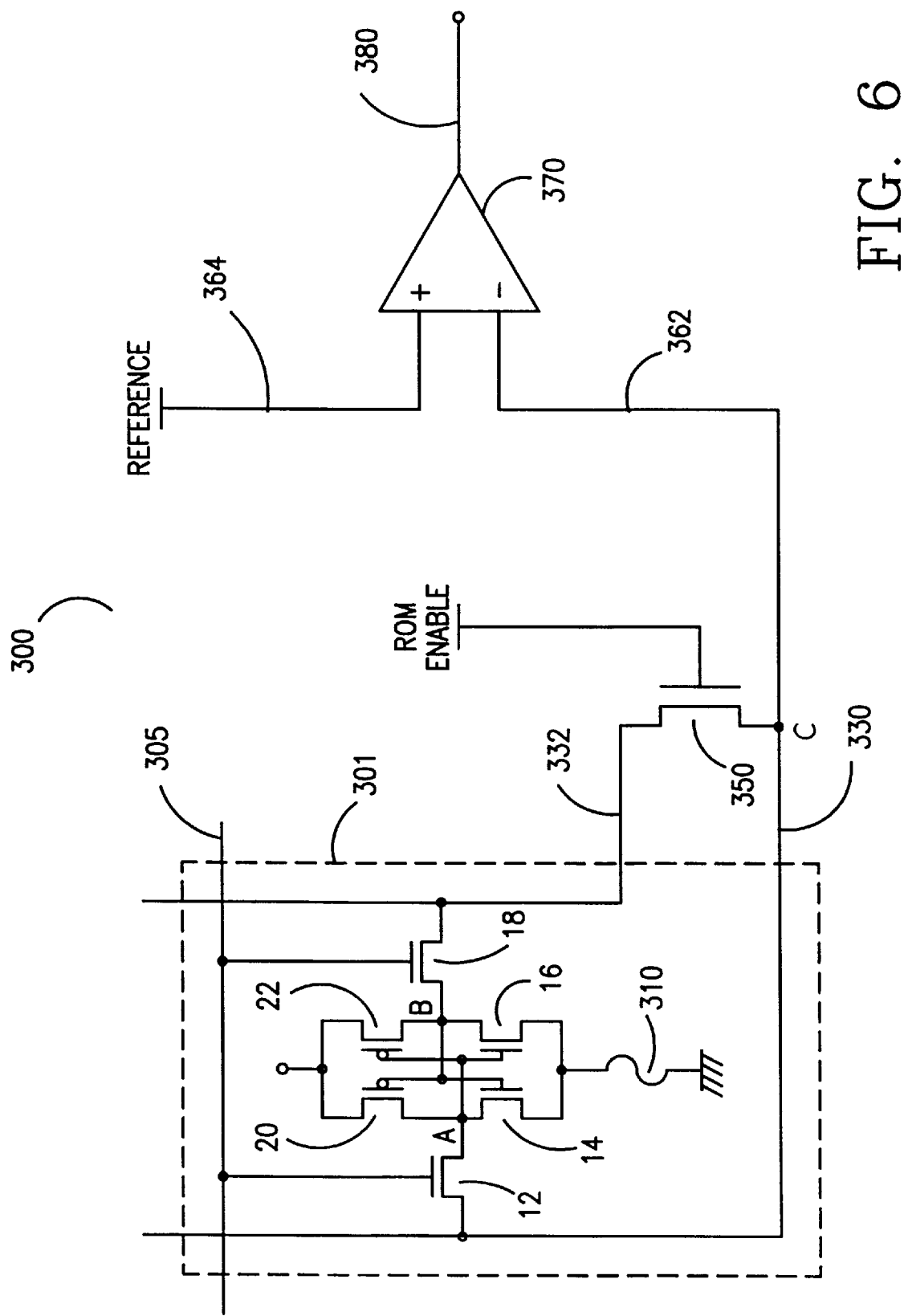
FIG. 6 illustrates a schematic of a ROM cell according to a third embodiment of the present invention.

FIG. 6 illustrates a ROM cell according to a third embodiment of the present invention. Utilizing this embodiment, a single SRAM cell along with a reference signal can be used as a single ROM cell.

ROM cell 300 comprises one SRAM cell 301. SRAM cell 301 is comprised of six transistors 12, 14, 16, 18, 20 and 22 as hereinbefore described with reference to FIG. 1. SRAM cell 301 is activated by word line 305, and outputs the cell contents on bit lines 330, 332. The operation of cell 301 is identical to that of cell 10 described with reference to FIG. 1 and will not be repeated here.

In accordance with the present invention, cell 301 has fuse 310 located in its ground path. The bit lines 330, 332 of cell 301 are connected together at node C through transistor 350. The gate of transistor 350 is connected to a ROM Enable signal. The signal at node C is input to sense amplifier 370 by line 362. A reference signal is input to the other input terminal of sense amplifier 370 by line 364.

The operation of ROM cell 300 is as follows. By opening or not opening fuse 310, ROM bit 300 can be programmed.

When power is provided to the memory, cell 301 will assume a random state, i.e. either a logic '1' or a logic '0', since the cell has not been written with either a '1' or '0'. If fuse 310 is not open, the cell 301 is connected to ground. Depending upon the logic state, cell current will flow through either bit line 332 (if the logic state is '1') or through bit line 330 (if the logic state is '0'). When transistor 350 is turned on by a ROM Enable signal, bit lines 332 and 330 are connected together at node C. The cell current from either bit line 330 or 332 will cause an associated voltage drop at node C. The voltage drop associated with the cell current will be carried by line 362 for input into sense amplifier 370.

If fuse 310 is opened, no cell current will flow on either bit line 332 or 330 because cell 310 has no ground connection. When transistor 350 is turned on by a ROM Enable signal, bit lines 332 and 330 are connected together at node C. Since there is no cell current from either bit line 330 or 332, there will be no associated voltage drop at node C. The signal at node C, without any voltage drop, will be carried by line 362 for input into sense amplifier 370.

A reference signal is input on line 364 into the other input terminal of sense amplifier 370. The reference signal can be set to provide an output 380 from sense amplifier 370 depending upon the voltage drop or lack of a voltage drop on line 362. Thus, when cell current is present, i.e. fuse 310 is not open, the reference signal can be set to provide either a high or low output on line 380. Conversely, if there is no cell current present, i.e. fuse 310 is open, the reference signal can be set to provide either a high or low output on line 380. The setting of the reference signal, and thus the programming of the ROM cell 300, will depend upon the signal availability, designer preference, etc.

The process for disconnecting the cell from ground is not limited to the use of an electrical fuse as previously described. For example, the ground connection can be removed utilizing a laser fuse. A polysilicon link with contacts at each end may be used to connect the cell to ground. A laser is used to vaporize the polysilicon connection during the wafer probe process, thus disconnecting the cell from ground. Alternatively, the ground connection can be removed during the fabrication process by changing the mask used during fabrication to remove the ground connection of the desired cells.

While reference has been made in the above embodiments to programming the SRAM cells to operate as a ROM cell by disabling the SRAM cells, i.e. preventing the flow of cell current, by removing the ground connection, the invention is not so limited. The SRAM cells could also be disabled by removing the power connection to the SRAM cell utilizing any of the methods previously described, i.e. a fuse, polysilicon link or fabrication mask.

Figure 7:
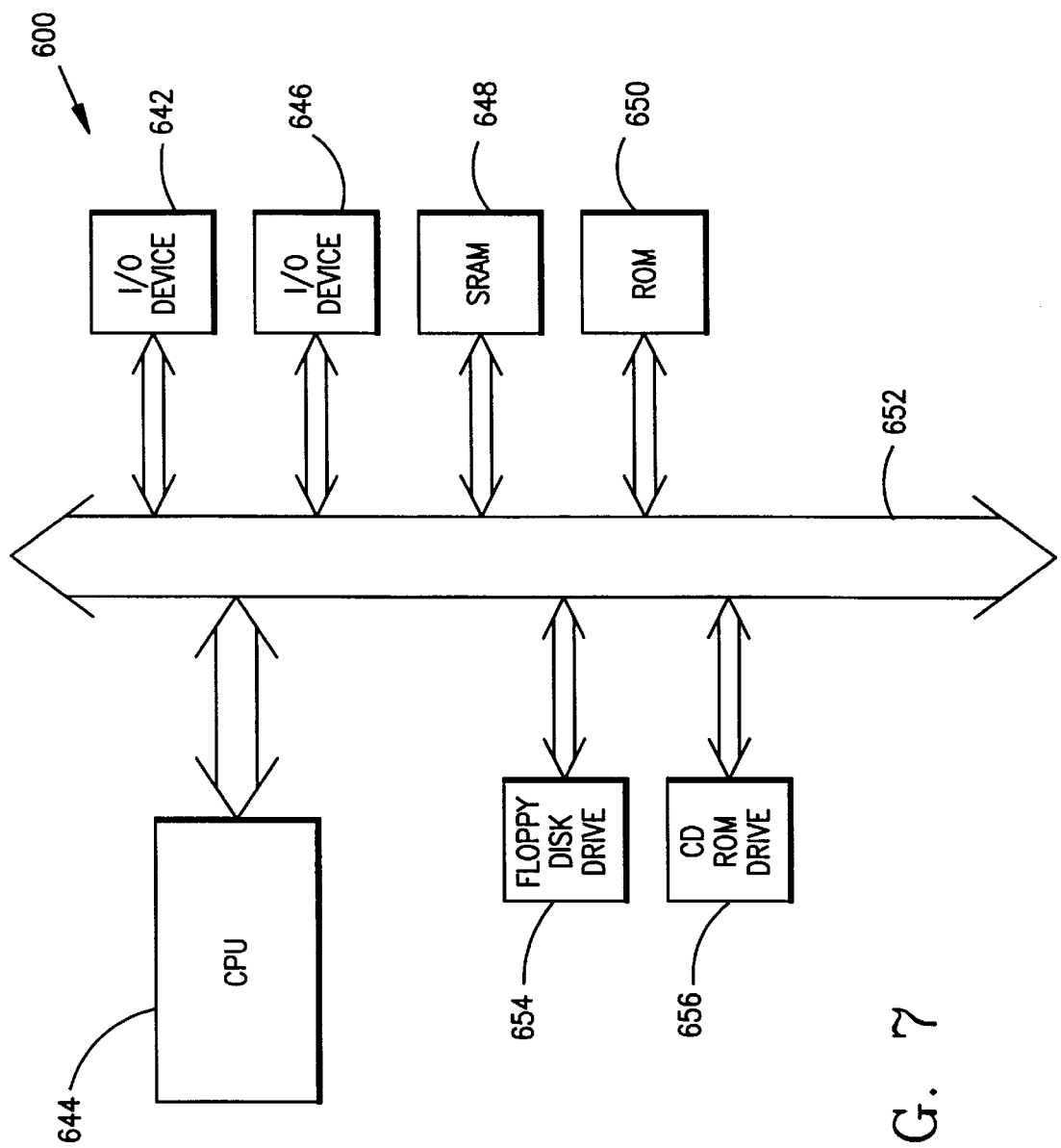
FIG. 7 illustrates in block diagram form a typical processor controlled system in which the present invention would be used.

A typical processor system which includes a memory device with embedded ROM according to the present invention is illustrated generally at 600 in FIG. 7. A computer system is exemplary of a device having digital circuits which include memory devices. Most conventional computers include memory devices permitting the storage of significant amounts of data. The data is accessed during operation of the computers. Other types of dedicated processing systems, e.g. radio systems, television systems, GPS receiver systems, telephones and telephone systems also contain memory devices which can utilize the present invention.

A processor system, such as a computer system, generally comprises a central processing unit (CPU) 644 that communicates to an input/output (I/O) device 642 over a bus 652. A second I/O device 646 is illustrated, but may not be necessary depending upon the system requirements. The computer system 640 also includes static random access memory (SRAM) 648, read only memory (ROM) 650, and may include peripheral devices such as a floppy disk drive 654 and a compact disk (CD) ROM drive 656 which also communicate with CPU 644 over the bus 652. It must be noted that the exact architecture of the computer system 600 is not important and that any combination of computer compatible devices may be incorporated into the system.

Utilizing the method of the present invention, additional ROM can be embedded into SRAM 648. The existing support circuitry for SRAM 648, such as sense amplifiers, bit-line loads, etc. would be used to implement the present invention.

Reference has been made to preferred embodiments in describing the invention. However, additions, deletions, substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed as new and desired to be protected by Letters Patent of the United States is:

1. A method for programming at last two SRAM cells located in a SRAM array comprising a plurality of memory cells to function as a ROM cell and permanently store a logic state, each of said plurality of memory cells having a ground connection and a pair of bit lines associated with it, said method comprising the steps of:

connecting said pair of bit lines associated with a first of said plurality of memory cells together;

connecting said pair of bit lines associated with a second of said plurality of memory cells together;

maintaining said ground connection or opening said ground connection of said first of said plurality of memory cells, wherein a signal at said connection of said pair of bit lines associated with said first of said plurality of memory cells will be produced, said maintaining of said ground connection causing a different signal at said connection of said pair of bit lines than said opening of said ground connection;

maintaining said ground connection or opening said ground connection of said second of said plurality of memory cells, wherein a signal at said connection of said pair of bit lines associated with said second of said plurality of memory cells will be produced, said maintaining of said ground connection causing a different signal at said connection of said pair of bit lines than said opening of said ground connection;

reading said produced signals at said connection of said pair of bit lines associated with said first of said memory cells and said connection of said pair of bit lines associated with said second of said memory cells; and outputting a signal based on said read produced signals associated with said stored logic state.

2. The method according to claim 1 further comprising: using a sense amplifier to read said produced signal.

3. The method according to claim 1, wherein said ground connection of said first of said plurality of memory cells is maintained and said ground connection of said second of said plurality of memory cells is opened.

4. The method according to claim 1 wherein said ground connection of said first of said plurality of memory cells is opened and said ground connection of said second of said plurality of memory cells is maintained.

5. The method according to claim 1 further comprising:
breaking a fuse connection to open said ground connection of said first or second of said memory cells.

6. The method according to claim 1, wherein said ground connection of each of said plurality of memory cells is formed from a conductive link, said method further comprising:
severing said conductive link and opening said ground connection of said first or second of said memory cells.

7. The method according to claim 1 further comprising:
opening said ground connection of said first or second of said memory cells during a fabrication process of said memory array.

8. The method according to claim 1, wherein said pair of bit lines associated with said first of said plurality of memory cells are connected together through a first transistor, and said pair of bit lines associated with said second of said plurality of memory cells are connected together through a second transistor.

9. The method according to claim 8, wherein said first and second transistors are enabled by a ROM Enable signal.

10. A method for programming a single SRAM cell located in a SRAM array comprising a plurality of memory cells to function as a ROM cell and permanently store a logic state, said single SRAM cell having a ground connection and a pair of bit lines associated with it, said method further comprising the steps of:
connecting said pair of bit lines together;
maintaining said ground connection or opening said ground connection, wherein a signal at said connection of said pair of bit lines will be produced, said maintaining of said ground connection causing a different signal at said connection of said pair of bit lines than said opening of said ground connection;
comparing said signal at said connection of said bit lines with a reference signal; and
outputting a signal representing said stored logic state associated with said maintained or opened ground connection.

11. The method according to claim 10 further comprising:
using a sense amplifier to compare said signal at said connection of said bit lines and said reference signal.

12. The method according to claim 10 further comprising:
breaking a fuse connection to open said ground connection.

13. The method according to claim 10, wherein said ground connection is formed through a conductive link, said method further comprising:
severing said conductive link and opening said ground connection.

14. The method according to claim 10 further comprising:
opening said ground connection during a fabrication process of said memory array.

15. The method according to claim 10, wherein said pair of bit lines are connected together through a transistor.

16. The method according to claim 15, wherein said transistor is enabled by a ROM Enable signal.

17. A method for programming a plurality of SRAM cells located in a SRAM array comprising a plurality of memory cells to function as a ROM cell and permanently store a logic state, each of said plurality of memory cells having a first and a second ground connection, said first ground connection being shared with a first adjacent memory cell, said second ground connection being shared with a second adjacent memory cell, each of said memory cells having a pair of bit lines associated with it, said method comprising the steps of:
maintaining said first ground connection or opening said first ground connection of one of said plurality of memory cells, wherein a signal at a first bit line of said pair of bit lines associated with said one of said memory cells will be produced, said maintaining of said first ground connection causing a different signal at said first bit line of said pair of bit lines than said opening of said first ground connection;
maintaining said second ground connection or opening said second ground connection of said one of said plurality of memory cells, wherein a signal at a second bit line of said pair of bit lines associated with said one of said memory cells will be produced, said maintaining of said second ground connection causing a different signal at said second bit line of said pair of bit lines associated with said one of said memory cells than said opening of said second ground connection;
reading said produced signals on said first bit line and said second bit line of said pair of bit lines associated with said one of said memory cells; and
outputting a signal representing said stored logic state associated with said maintained or opened first and second ground connection.

18. The method according to claim 17 further comprising:
using a sense amplifier to read said produced signals.

19. The method according to claim 17, wherein said first ground connection of said one of said memory cells is maintained and said second ground connection of said one of said memory cells is opened.

20. The method according to claim 17 wherein said first ground connection of said one of said memory cells is opened and said second ground connection of said one of said memory cells is maintained.

21. The method according to claim 17 further comprising:
breaking a fuse connection to open said first or said second ground connection of said one of said memory cells.

22. The method according to claim 17, wherein said first and said second ground connection of each of said plurality of memory cells is formed from a conductive link, said method further comprising:
severing said conductive link and opening said first or said second ground connection of said one of said memory cells.

23. The method according to claim 17 further comprising:
opening said first or said second ground connection of said one of said memory cells during a fabrication process of said memory array.

24. A semiconductor memory device comprising:
a plurality of SRAM cells, each of said SRAM cells located in a memory array comprising a plurality of memory cells, each of said plurality of SRAM cells having a ground connection and a pair of bit lines associated with it, said pair of bit lines of a first cell of said plurality of SRAM cells being connected together, said pair of bit lines of a second cell of said plurality of SRAM cells being connected together;
a plurality of sense amplifiers, each having a first and second input and an output, said first input of one of said plurality of sense amplifiers being connected to said connected pair of bit lines of said first cell, said second input of said one of said plurality of sense amplifiers being connected to said connected pair of bit lines of said second cell, whereby opening or maintaining said ground connection of said first cell and said second cell produces a signal on said connected bit lines to be read by said sense amplifier, said maintaining of said ground connection causing a different signal at said connection of said pair of bit lines than said opening of said ground connection, and said sense amplifier outputs a signal representative of a stored logic state associated with said opened or maintained ground connections of said first cell and said second cell;

whereby said first cell and said second cell are programmed to function as a ROM cell and permanently store a logic signal.

25. The semiconductor memory device according to claim 24, wherein said ground connection of said first cell of said plurality of SRAM cells is maintained and said ground connection of said second cell of said plurality of SRAM cells is opened.

26. The semiconductor memory device according to claim 24 wherein said ground connection of said first cell of said plurality of SRAM cells is opened and said ground connection of said second cell of said plurality of SRAM cells is maintained.

27. The semiconductor memory device according to claim 24 further comprising:

a fuse in said ground connection of said first cell or said second cell of said plurality of SRAM cells, whereby opening said fuse opens said ground connection.

28. The semiconductor memory device according to claim 24, wherein said ground connection of each of said plurality of SRAM cells is formed from a conductive link, and said ground connection is opened by using a laser to sever said conductive link.

29. The semiconductor memory device according to claim 24 wherein opening said ground connection of said first cell or said second cell of said SRAM cells is done during a fabrication process of said plurality of SRAM cells.

30. The semiconductor memory device according to claim 24 further comprising:

a first transistor, wherein said pair of bit lines associated with said first cell of said plurality of SRAM cells are connected together through said first transistor; and a second transistor, wherein said pair of bit lines associated with said second cell of said plurality of SRAM cells are connected together through said second transistor.

31. The semiconductor memory device according to claim 30, wherein said first and second transistors are enabled by a ROM Enable signal.

32. A semiconductor memory comprising:

a plurality of SRAM cells, each of said SRAM cells located in a memory array comprising a plurality of memory cells, each of said plurality of SRAM cells having a ground connection and a pair of bit lines associated with it, said pair of bit lines of a first cell of said plurality of SRAM cells being connected together;

a plurality of sense amplifiers, each having a first and second input and an output, said first input of one of said plurality of sense amplifiers being connected to said connected pair of bit lines of said first cell, said second input of said one of said plurality of sense amplifiers being connected to a reference signal, whereby opening or maintaining said ground connection of said first cell produces a signal on said connected bit lines to be read by said sense amplifier, said maintaining of said ground connection causing a different signal at said connection of said pair of bit lines than said opening of said ground connection, and said sense amplifier outputs a signal representative of a stored logic state associated with said opened or maintained ground connection of said first cell;

whereby said first cell is programmed to function as a ROM cell and permanently store a logic signal.

33. The semiconductor memory device according to claim 32 further comprising:

a fuse in said ground connection of said first cell of said plurality of SRAM cells, whereby opening said fuse opens said ground connection.

34. The semiconductor memory device according to claim 32, wherein said ground connection of each of said plurality of SRAM cells is formed from a conductive link, and said ground connection of said first cell is opened by using a laser to sever said conductive link.

35. The semiconductor memory device according to claim 32, wherein said conductive link is a polysilicon link.

36. The semiconductor memory device according to claim 32 wherein opening said ground connection of said first cell of said SRAM cells is done during a fabrication process of said plurality of SRAM cells.

37. The semiconductor memory device according to claim 32 further comprising:

a first transistor, wherein said pair of bit lines associated with said first cell of said plurality of SRAM cells are connected together through said first transistor.

38. The semiconductor memory device according to claim 37, wherein said first transistor is enabled by a ROM Enable signal.

39. A semiconductor memory device comprising:

a plurality of SRAM cells, each of said SRAM cells located in a memory array comprising plurality of memory cells, each of said plurality of memory cells having a first and a second ground connection, said first ground connection being shared with a first adjacent memory cell, said second ground connection being shared with a second adjacent memory cell, each of said memory cells having a pair of bit lines associated with it;

a plurality of sense amplifiers, each having a first and second input and an output, said first input of one of said plurality of sense amplifiers being connected to a first of said pair of bit lines of a first SRAM cell, said second input of said one of said plurality of sense amplifiers being connected to a second of said pair of bit lines of said first SRAM cell, whereby opening or maintaining said first and said second ground connection of said first cell produces a signal on said first and said second bit lines to be read by said sense amplifier, said maintaining of a ground connection causing a different signal at said bit lines than said opening of said ground connection, and said sense amplifier outputs a signal representative of a stored logic state associated with said opened or maintained first and second ground connections of said first cell;

whereby said first cell is programmed to function as a ROM cell and permanently store a logic signal.

40. The semiconductor memory device according to claim 39, wherein said first ground connection of said first cell is maintained and said second ground connection of said first cell is opened.

41. The semiconductor memory device according to claim 39 wherein said first ground connection of said first cell is opened and said second ground connection of said first cell is maintained.

42. The semiconductor memory device according to claim 39 further comprising:
a fuse in said first and said second ground connection of said first cell, whereby opening said fuse opens said ground connection.

43. The semiconductor memory device according to claim 39, wherein said first and said second ground connection of each of said plurality of SRAM cells is formed from a conductive link, and said first or said second ground connections are opened by severing said conductive link.

44. The semiconductor memory device according to claim 43, wherein said conductive link is a polysilicon link.

45. The semiconductor memory device according to claim 39 wherein opening said first or said second ground connection of said first cell is done during a fabrication process of said plurality of SRAM cells.

46. A processor system comprising:
a central processing unit; and
a memory device comprising a plurality of SRAM cells, said SRAM cells being located in a memory array comprising a plurality of memory cells, wherein one or more of said SRAM cells is programmed to function as a ROM cell and permanently store a logic state, each of said SRAM cells having a ground connection and a pair of bit lines associated with it, said pair of bit lines of a first cell of said plurality of SRAM cells being connected together, said pair of bit lines of a second cell of said plurality of SRAM cells being connected together; and
a plurality of sense amplifiers, each having a first and second input and an output, said first input of one of said plurality of sense amplifiers being connected to said connected pair of bit lines of said first cell, said second input of said one of said plurality of sense amplifiers being connected to said connected pair of bit lines of said second cell,
whereby opening or maintaining said ground connection of said first cell and said second cell produces a signal on said connected bit lines to be read by said sense amplifier, said maintaining of said ground connection causing a different signal at said connection of said pair of bit lines than said opening of said ground connection, and said sense amplifier outputs a signal representative of a stored logic state associated with said opened or maintained ground connections of said first cell and said second cell;
whereby said first cell and said second cell are programmed to function as a ROM cell and permanently store a logic signal.

47. The processor system according to claim 46, wherein said ground connection of said first cell of said plurality of SRAM cells is maintained and said ground connection of said second cell of said plurality of SRAM cells is opened.

48. The processor system according to claim 46 wherein said ground connection of said first cell of said plurality of SRAM cells is opened and said ground connection of said second cell of said plurality of SRAM cells is maintained.

49. The processor system according to claim 46, wherein said memory device further comprises:
a fuse in said ground connection of said first cell or said second cell of said plurality of SRAM cells, whereby opening said fuse opens said ground connection.

50. The processor system according to claim 46, wherein said ground connection of each of said plurality of SRAM cells is formed from a conductive link, and said ground connection is opened by severing said conductive link.

51. The processor system according to claim 46 wherein opening said ground connection of said first cell or second cell of said SRAM cells is done during a fabrication process of said plurality of SRAM cells.

52. The processor system according to claim 46, wherein said memory device further comprises:
a first transistor, wherein said pair of bit lines associated with said first cell of said plurality of SRAM cells are connected together through said first transistor; and
a second transistor, wherein said pair of bit lines associated with said second cell of said plurality of SRAM cells are connected together through said second transistor.

53. The processor system according to claim 52, wherein said first and second transistors are enabled by a ROM Enable signal.

54. A processor system comprising:
a central processing unit;
a memory device comprising a plurality of SRAM cells, said SRAM cells being located in a memory array comprising a plurality of memory cells, wherein one or more of said SRAM cells is programmed to function as a ROM cell and permanently store a logic state, each of said SRAM cells having a ground connection and a pair of bit lines associated with it, said pair of bit lines of a first cell of said plurality of SRAM cells being connected together; and
a plurality of sense amplifiers, each having a first and second input and an output, said first input of one of said plurality of sense amplifiers being connected to said connected pair of bit lines of said first cell, said second input of said one of said plurality of sense amplifiers being connected to a reference signal,
whereby opening or maintaining said ground connection of said first cell produces a signal on said connected bit lines to be read by said sense amplifier, said maintaining of said ground connection causing a different signal at said connection of said pair of bit lines than said opening of said ground connection, and said sense amplifier outputs a signal representative of a stored logic state associated with said opened or maintained ground connection of said first cell;
whereby said first cell is programmed to function as a ROM cell and permanently store a logic signal.

55. The processor system according to claim 54, wherein said memory device further comprises:
a fuse in said ground connection of said first cell of said plurality of SRAM cells, whereby opening said fuse opens said ground connection.

56. The processor system according to claim 54, wherein said ground connection of each of said plurality of SRAM cells is formed from a conductive link, and said ground connection of said first cell is opened by severing said conductive link.

57. The processor system according to claim 54 wherein opening said ground connection of said first cell of said SRAM cells is done during a fabrication process of said plurality of SRAM cells.

58. The processor system according to claim 54, wherein said memory device further comprises:
a first transistor, wherein said pair of bit lines associated with said first cell of said plurality of SRAM cells are connected together through said first transistor.

59. The processor system according to claim 58, wherein said first transistor is enabled by a ROM Enable signal.

60. A processor system comprising:

a central processing unit;

a memory device comprising a plurality of SRAM cells, said SRAM cells being located in a memory array comprising a plurality of memory cells, wherein one or more of said SRAM cells is programmed to function as a ROM cell and permanently store a logic state, wherein each of said plurality of memory cells has a first and a second ground connection, said first ground connection being shared with a first adjacent memory cell, said second ground connection being shared with a second adjacent memory cell, each of said memory cells having a pair of bit lines associated with it; and a plurality of sense amplifiers, each having a first and second input and an output, said first input of one of said plurality of sense amplifiers being connected to a first of said pair of bit lines of a first SRAM cell, said second input of said one of said plurality of sense amplifiers being connected to a second of said pair of bit lines of said first SRAM cell, whereby opening or maintaining said first and said second ground connection of said first cell produces a signal on said first and said second bit lines to be read by said sense amplifier, said maintaining of a ground connection causing a different signal at said bit lines than said opening of said ground connection, and said sense amplifier outputs a signal representative of a stored logic state associated with said opened or maintained first and second ground connections of said first cell;

whereby said first cell is programmed to function as a ROM cell and permanently store a logic signal.

61. The processor system according to claim 60, wherein said first ground connection of said first cell is maintained and said second ground connection of said first cell is opened.

62. The processor system according to claim 60 wherein said first ground connection of said first cell is opened and said second ground connection of said first cell is maintained.

63. The processor system according to claim 60, wherein said memory device further comprises:

a fuse in said first and said second ground connection of said first cell, whereby opening said fuse opens said respective ground connection.

64. The processor system according to claim 60, wherein said first and said second ground connection of each of said plurality of SRAM cells is formed from a conductive link, and said first or said second ground connections are opened by severing said conductive link.

65. The processor system according to claim 60 wherein opening said first or said second ground connection of said first cell is done during a fabrication process of said plurality of SRAM cells.

* * * * *

UNITED STATES PATENT AND TRADEMARK OFFICE
CERTIFICATE OF CORRECTION

PATENT NO.    : 6,041,008

DATED         : Mar. 21, 2000

INVENTOR(S)   : Kenneth W. Marr

It is certified that errors appear in the above-identified patent and that said Letters Patent is hereby corrected as shown below:

Claim 1, line 1, before "two", delete "last", substitute --least--.

Claim 35, lines 1-2, after "claim", delete "32", substitute --34--.

Signed and Sealed this

Thirtieth Day of January, 2001

Attest:

Q. TODD DICKINSON -

*Attesting Officer*                *Director of Patents and Trademarks*